(12) United States Patent
Gillard et al.

(10) Patent No.: US 8,559,155 B2
(45) Date of Patent: Oct. 15, 2013

(54) DIRECTING THE FLOW OF ELECTROSTATIC DISCHARGE (ESD) CURRENT TO A TARGETED IMPEDANCE USING NESTED PLATES

(75) Inventors: Edward C. Gillard, Mantorville, MN (US); Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 13/086,992

(22) Filed: Apr. 14, 2011

(65) Prior Publication Data

US 2012/0262826 A1    Oct. 18, 2012

(51) Int. Cl.
| H02H 1/00 | (2006.01) |
| H02H 9/00 | (2006.01) |
| H02H 3/22 | (2006.01) |
| H05F 3/00 | (2006.01) |
| H05F 3/02 | (2006.01) |
| H04R 25/00 | (2006.01) |

(52) U.S. Cl.
USPC .......................................................... 361/212

(58) Field of Classification Search
USPC ............ 361/56, 212, 220, 222, 111; 381/380; 312/223.2
See application file for complete search history.

(56) References Cited

U.S. PATENT DOCUMENTS

| 5,335,137 A | 8/1994 | English et al. |
| 6,000,767 A * | 12/1999 | Liu et al. .................... 312/223.2 |
| 6,068,782 A | 5/2000 | Brandt et al. |
| 7,141,743 B2 | 11/2006 | Cunningham et al. |
| 7,366,554 B2 | 4/2008 | Hayes |
| 2009/0312656 A1 | 12/2009 | Lau et al. |
| 2011/0007929 A1 | 1/2011 | Rabu et al. |

OTHER PUBLICATIONS

Wikipedia contributors, "Electrostatic discharge", Wikipedia, The Free Encyclopedia, 6 pages, Feb. 14, 2011, 17:53 UTC. Retrieved from: http://en.wikipedia.org/w/index.php?title=Electrostatic_discharge&oldid=413911210.

"ESD Terms", NASA Electrical Engineering Division (Code 560), Parts, Packaging, and Assembly Technologies Office (Code 562), accessed on May 16, 2013 at <http://eed.gsfc.nasa.gov/562/ESD_Terms.htm>.

* cited by examiner

*Primary Examiner* — Jared Fureman
*Assistant Examiner* — Lucy Thomas
(74) *Attorney, Agent, or Firm* — Matthew J. Bussan

(57) ABSTRACT

A mechanism for protecting objects sensitive to electrostatic discharge (ESD) employs nested plates to direct the flow of ESD current to a targeted impedance. In one embodiment, an insulator plate is interposed between first and second electrically conductive plates. The insulator plate prevents any charge accumulating on the first plate from arcing to the second plate through the insulator plate. A target plate of electrically conductive material is interposed between the first and second plates over a hole in the insulator plate. The target plate, which is surrounded by an impedance layer of static dissipative material, includes a discharge portion that projects toward the second plate. ESD current flows in a path from the first plate, through the impedance layer, the target plate and again through the impedance layer, and to the second plate. The impedance layer provides a targeted impedance in the ESD current path.

20 Claims, 6 Drawing Sheets

DIRECTING THE FLOW OF ELECTROSTATIC DISCHARGE (ESD) CURRENT TO A TARGETED IMPEDANCE USING NESTED PLATES

BACKGROUND OF THE INVENTION

1. Field of Invention

The present invention relates in general to circuit assemblies, such as printed circuit boards (PCBs), and other objects that are sensitive to electrostatic discharge (ESD). More particularly, the present invention relates to protecting objects that are sensitive to ESD by using nested plates to direct the flow of ESD current to a targeted impedance.

2. Background Art

Electrostatic discharge (ESD) is the sudden and momentary electrical current that flows between two objects at different electrical potentials. These momentary electrical currents may disturb or cause damage to circuit assemblies, such as printed circuit boards (PCBs), and other objects that are sensitive to ESD.

Circuit assemblies are typically populated with integrated circuits (ICs) that are made from materials (i.e., electrically conductive materials, semiconductor materials and insulator materials) susceptible to disruption or permanent damage when subjected to the voltages associated with an ESD event. For example, electrostatic charges that accumulate on an enclosure of an electronic device can create a high voltage that may discharge into the ICs of circuit assemblies within the enclosure. The voltage applied to the ICs through this ESD event can alter the state of and/or cause damage to one or more of the ICs.

Typically, ESD events are caused by static electricity. Static electricity can build up on objects and people. For example, static electricity can be generated through tribocharging. Tribocharging is the separation of electric charges that occurs when two dissimilar materials interact, e.g., the materials are brought into contact and separated. Perhaps the best known example of tribocharging occurs when a person walks on a rug. The resulting build up of electrostatic charge on that person can lead to an ESD event (e.g., a spark) when the person comes into contact with another person or an object such as an electronic device.

ESD events are also caused by electrostatic induction. Electrostatic induction occurs when an electrically charged object is placed near a conductive object isolated from ground.

Electromagnetic compatibility (EMC) issues can also play a role in ESD events. For example, the emission of electromagnetic waves can cause the build up of electrostatic charge on objects and people.

The most spectacular form of ESD is a spark (sometimes referred to as an "arc"), which occurs when an ionized conductive channel is created in an insulator such as air between two objects at different electrical potentials. A high voltage differential between the two objects may cause the air in the vicinity to ionize and thus create a low impedance path to discharge the high voltage. The result is a spark, which can cause minor discomfort to people, disruption or damage to electronic equipment, and fires and explosions if the air contains combustible gases or particles. For example, methane and coal dust explosions have been caused by electrostatic discharges.

Therefore, a need exists for an enhanced mechanism for protecting objects that are sensitive to ESD.

SUMMARY OF THE INVENTION

According to the preferred embodiments of the present invention, a mechanism for protecting objects sensitive to electrostatic discharge (ESD) employs nested plates to direct the flow of ESD current to a targeted impedance. An insulator plate is interposed between first and second electrically conductive plates. The insulator plate prevents any charge accumulating on the first plate from arcing to the second plate through the insulator plate. A target plate of electrically conductive material is interposed between the first and second plates over a hole in the insulator plate. The target plate, which is surrounded by an impedance layer of static dissipative material, includes a discharge portion that projects toward the second plate. ESD current flows in a path from the first plate, through impedance layer, the target plate and again through the impedance layer, and to the second plate. The impedance layer provides a targeted impedance in the ESD current path.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

1. Overview

In accordance with the preferred embodiments of the present invention, a mechanism for protecting objects sensitive to electrostatic discharge (ESD) employs nested plates to direct the flow of ESD current to a targeted impedance. An insulator plate is interposed between first and second electrically conductive plates. The insulator plate prevents any charge accumulating on the first plate from arcing to the second plate through the insulator plate. A target plate of electrically conductive material is interposed between the first and second plates over a hole in the insulator plate. The target plate, which is surrounded by an impedance layer of static dissipative material, includes a discharge portion that projects toward the second plate. ESD current flows in a path from the first plate, through the impedance layer, the target plate and again through the impedance layer, and to the second plate. The impedance layer provides a targeted impedance in the ESD current path.

2. Detailed Description

Figure 1:
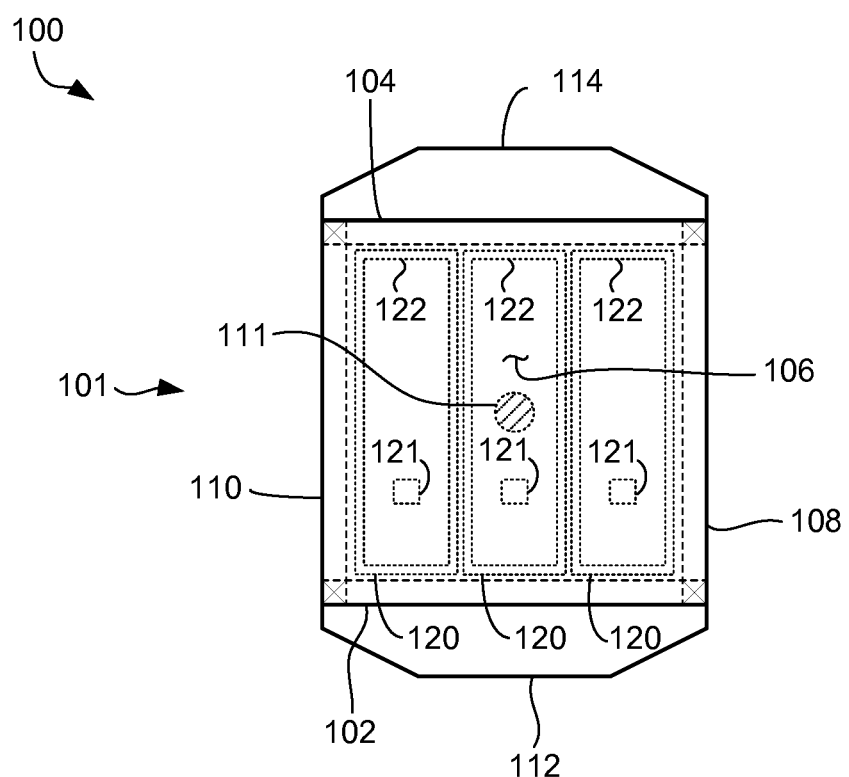
FIG. 1 is a top view of a server computer system incorporating a mechanism for directing the flow of electrostatic discharge (ESD) current to a targeted impedance in accordance with the preferred embodiments of the present invention.

With reference to the figures and in particular FIG. 1, there is depicted a top view of a server computer system 100 having a computer system enclosure 101 which incorporates a mechanism for directing the flow of electrostatic discharge (ESD) current to a targeted impedance in accordance with the preferred embodiments of the present invention. Although the preferred embodiments of the present invention are described herein within the context of an enclosure for containing a server computer system, those skilled in the art will appreciate that the present invention may be practiced with an enclosure for containing or a panel for covering any type of system, circuit assemblies, and other objects that are sensitive to ESD.

For example, the present invention may be practiced with any sort of cover, enclosure or container used for ESD control and/or electromagnetic compatibility (EMC) purposes including those used in consumer electronics, home appliances, automotive electronics such as electronic control modules (ECMs), sensitive radio frequency (RF) equipment, and flammable and/or explosive materials such as ammunition, as well as the exterior surfaces of vehicles such as the fuselage of planes, the skin of high speed trains, the hull of ships, and body of cars and trucks.

The present invention may also be practiced with an enclosure for containing or a panel for covering electronic equipment used in explosive environments such as mines, grain elevators/mills, refineries, and munitions factories.

Likewise, the present invention may be practiced with an enclosure for containing or a panel for covering a computer system different than that shown in FIG. 1. For example, the present invention can be applied to enclosures containing computer systems including, but not limited to, personal computers, servers and data storage systems, of various sizes such as laptops, small towers (e.g., desktop computer systems), individual rack units and large rack frames (receiving multiple server units).

As illustrated in FIG. 1, computer system enclosure 101 typically includes a front panel 102, a rear panel 104, a top panel 106, a bottom panel (not shown), and two side panels 108, 110. However, those skilled in the art will appreciate that computer system enclosure 101 may have any number and configuration of panels.

In the exemplary embodiment illustrated in FIG. 1, a mechanism for directing the flow of electrostatic discharge (ESD) current to a targeted impedance 111 in accordance with the preferred embodiments of the present invention is incorporated into the top panel 106 of the computer system enclosure 101. In the exemplary embodiment illustrated in FIG. 1, the targeted impedance 111 is represented by a single dashed circle. As discussed below with reference to FIGS. 3 and 4, the targeted impedance 111 is defined by an impedance layer of static dissipative material that surrounds a target plate. One skilled in the art will appreciate, however, that a mechanism for directing the flow of electrostatic discharge (ESD) current to a targeted impedance in accordance with the preferred embodiments of the present invention may be incorporated into one or more other panels of the computer system enclosure 101 in lieu of or in addition to the top panel 106, and that more than a single targeted impedance may be incorporated into the top panel 106 and/or the other panel(s).

Preferably, the location of the targeted impedance 111 is selected so as to be relatively remote from objects that are sensitive to ESD such as integrated circuits (ICs) (e.g., the ICs 121). Accordingly, the flow of ESD current is relatively remote from objects in the computer system enclosure 101 that are sensitive to ESD.

Typically, one or more vented covers 112, 114 are also provided. In the embodiment illustrated in FIG. 1, the vented covers 112, 114 are respectively mounted at the front and rear of computer system enclosure 101.

The vented covers 112, 114 are typically affixed to computer system enclosure 101 in a movable or removable manner to allow access to computer system components within computer system enclosure 101. In the embodiment illustrated in FIG. 2, vented covers 112, 114 are hingedly affixed to computer system enclosure 101 to permit access to removable drawers when vented covers 112, 114 are swung open. Alternatively, vented covers 112, 114 may be removably mounted to computer system 101, using fasteners such as bolts, screws, clamps or hangers.

Figure 2:
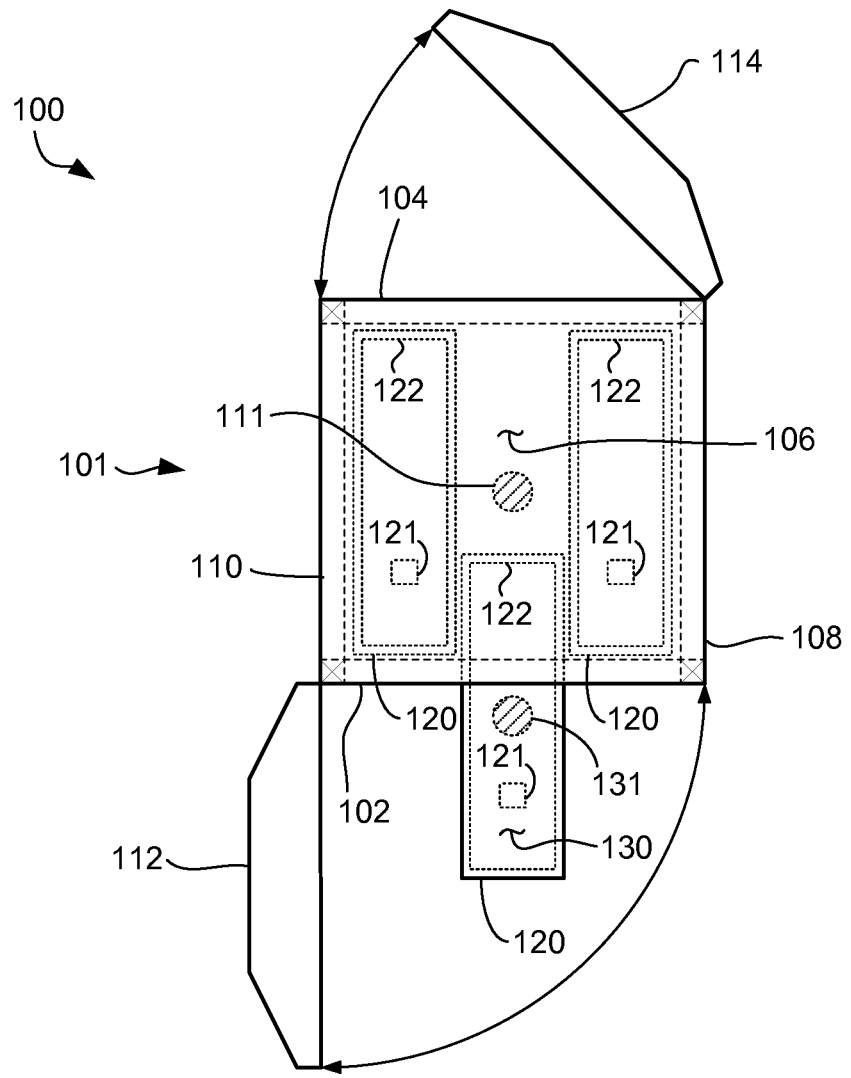
FIG. 2 is a top view of the server computer system shown in FIG. 1, with its vented covers open and an electronics drawer in a withdrawn position.

With reference now to both FIGS. 1 and 2, computer system enclosure 101 provides mechanical support for one or more electronic component packages, such as electronics drawers 120. The electronics drawers 120 are typically used to package processors of computer system 100, along with their associated electronics (e.g., memory, disk drives, power supplies, etc.). Alternatively, the processors of computer system 100 and their associated electronics may be mounted in computer system enclosure 101 without being packaged in electronics drawers. Preferably, electronics drawers 120 are slidably mounted within computer system enclosure 101, providing easy access to the contents of electronics drawers 120 for repair, maintenance, and upgrades. Alternatively, electronics drawers 120 may be permanently mounted within computer system enclosure 101, using fasteners such as bolts, screws or clamps.

Typically, the processors and their associated electronics are sensitive to ESD. In the exemplary embodiment illustrated in FIGS. 1 and 2, each electronic drawer 120 contains a printed circuit board (PCB) 122 that is populated with one or more electronic devices (e.g., the IC 121) that is/are sensitive to ESD.

In the exemplary embodiment illustrated in FIG. 2, a mechanism for directing the flow of electrostatic discharge (ESD) current to a targeted impedance 131 in accordance with the preferred embodiments of the present invention is incorporated into covers 130 (only one shown) of the electronic drawers 120 (in addition to the mechanism for directing the flow of electrostatic discharge (ESD) current to a targeted impedance 111 incorporated into the top panel 106). In the exemplary embodiment illustrated in FIG. 2, the targeted impedance 131 is represented by a single dashed circle. As discussed below with reference to FIGS. 3 and 4, the targeted impedance 131 is defined by an impedance layer of static dissipative material that surrounds a target plate. One skilled in the art will appreciate, however, that a mechanism for directing the flow of electrostatic discharge (ESD) current to a targeted impedance in accordance with the preferred embodiments of the present invention may be incorporated into one or more other panels of the electronic drawers 120 in lieu of or in addition to the cover 130, and that more than a single targeted impedance may be incorporated into the cover 130 and/or the other panel(s).

Preferably, the location of the targeted impedance 131 is selected so as to be relatively remote from objects that are sensitive to ESD such as integrated circuits (ICs) (e.g., the ICs 121). Accordingly, the flow of ESD current is relatively remote from objects in the electronic drawers 120 that are sensitive to ESD.

Figure 3:
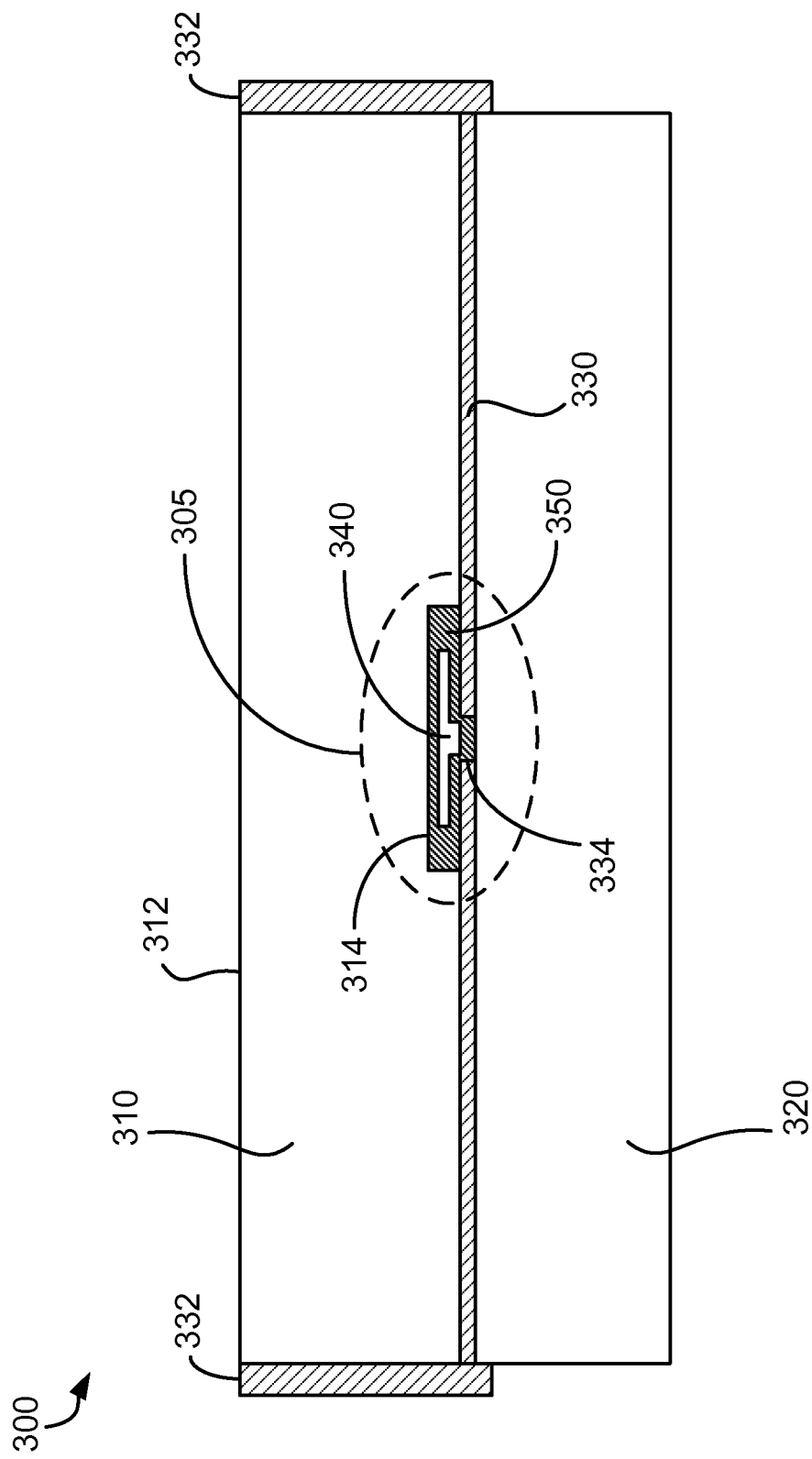
FIG. 3 is a sectional view of an enclosure panel in accordance with the preferred embodiments of the present invention.
Figure 4:
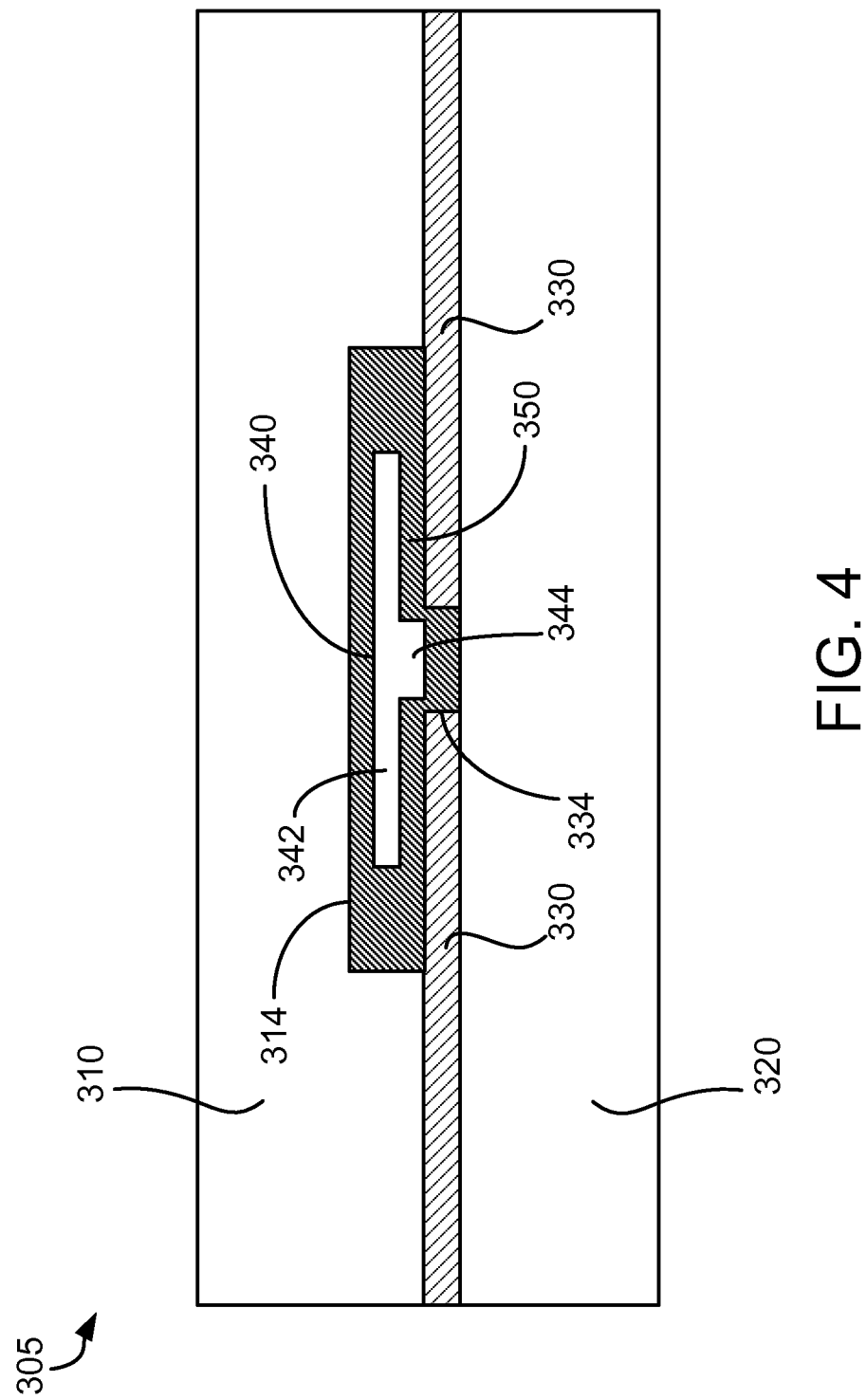
FIG. 4 is an enlarged view of a portion of the enclosure panel shown in FIG. 3.

FIG. 3 is a sectional view of an enclosure panel 300 in accordance with the preferred embodiments of the present invention. The enclosure panel 300 illustrated in FIG. 3 may correspond to the top panel 106 of the computer system enclosure 101 shown in FIGS. 1 and 2 and/or the covers 130 of the electronic drawers 120 of the computer system enclosure 101 shown in FIG. 2. FIG. 4 is an enlarged view of a portion 305 of the enclosure panel 300 shown in FIG. 3.

In accordance with the preferred embodiments of the present invention, a set of nested plates collects and directs the charge to a targeted impedance. The set of nested plates is configured so as to present a uniform impedance to the ESD current flow and establish a predetermined discharge path. It is important to actually engineer the discharge path rather than let the current flow by happenstance or having arcs occur near edges in an explosive environment. This results in a more controlled product design with respect to ESD current flow.

In general, controlling the flow of ESD current is important to product design to achieve immunity to charge that may disrupt or damage internal electronics or other objects sensitive to ESD.

Referring now to FIGS. 3 and 4, the enclosure panel 300 includes a first electrically conductive plate 310, a second electrically conductive plate 320, an insulator layer 330, a target plate 340, and an impedance layer 350. These elements, which are sometimes referred to herein as "a set of nested plates" or "nested plates", in accordance with the preferred embodiments of the present invention operate together to present a uniform impedance to ESD current flow and establish a predetermined discharge path.

The electrically conductive plate 310 includes a surface 312 that corresponds to the outside surface of an enclosure panel, such as the top panel 106 of the server computer enclosure 101 shown in FIGS. 1 and 2 and/or the covers 130 of the electronic drawers 120 of the computer system enclosure 101 shown in FIG. 2. These enclosure panels are subject to injection of electrostatic charge. For example, when a user who has walked on a rug comes in contact with the top panel 106 of the server computer enclosure 101, any accumulated electrostatic charge on the user is injected to the top panel 106. Similarly, when a service technician opens the cover 130 of one of the electronic drawers 120 of the computer system enclosure 101, any accumulated electrostatic charge on the service technician is injected to the cover 130. In accordance with the preferred embodiments of the present invention, upon being injected to the enclosure panel, the charge distributes itself across the volume of the electrically conductive plate 310 and is then directed towards the center of the target plate 340 (i.e., the path of lowest electrical impedance) through the impedance layer 350 and ultimately to the electrically conductive plate 320 (which is preferably connected to ground).

The electrically conductive plates 310 and 320 are constructed from one or more electrically conductive materials. For example, the electrically conductive plates 310 and 320 may be formed from stainless steel, aluminum or other suitable metals (including elemental metals and metal alloys). Alternatively, the electrically conductive plates 310 and 320 may be formed from molded plastic (e.g., ABS or styrene) that has conductive material filler (e.g., stainless steel, aluminum, carbon, or graphite fibers) embedded in the plastic to provide the desired level of electrical conductivity. The electrically conductive plates 310 and 320 may be constructed from the same or different materials with respect to each other. The electrically conductive plates 310 and 320 may be constructed as a single-layer-plate or a multiple-layer-plate.

Preferably, the electrically conductive plate 310 includes at least one recess 314 to accommodate the target plate 340 and a portion of the impedance layer 350.

Preferably, the electrically conductive plate 320 is connected to ground.

Typically, the electrically conductive plates 310 and 320 are constructed from metal plate or sheet metal using conventional metalworking techniques. For example, the electrically conductive plate 310 may be constructed from a metal plate that is machined to form the recess 314.

In another embodiment, the electrically conductive plate 310 and/or the electrically conductive plate 320 is/are constructed from conductive plastic (i.e., plastic with embedded conductive filler). For example, the electrically conductive plate 310 may be constructed from conductive plastic that is molded to form the recess 314.

In yet another embodiment, the electrically conductive plate 310 and/or the electrically conductive plate 320 is/are formed by depositing one or more thin metal films using chemical vapor deposition, physical vapor deposition, flame-spray techniques, thermal decomposition of a suitable metal-organic compound, or electroless or electrolytic plating with one or more suitable metals. For example, the electrically conductive plate may be formed by depositing one or more thin metal films on the insulator layer 330 and the impedance layer 350.

The insulator layer 330 is constructed from one or more electrically non-conductive materials. For example, the insulator layer 330 may be constructed from silicon dioxide or other suitable electrical insulator or dielectric. A "suitable electric insulator or dielectric" will prevent the high voltage that occurs on the electrically conductive plate 310 from arcing through the insulator layer 330 to the electrically conductive plate 320. Along with the selection of the non-conductive material(s) from which the insulator layer 330 is constructed, the thickness of the insulator layer 330 is also a factor in preventing arcing through the insulator layer 330. Preferably, the insulator layer 330 includes a plurality of end-caps 332 to prevent the high voltage that occurs on the electrically conductive plate 310 from arcing to the electrically conductive plate 320 at the edges of the electrically conductive plates 310 and 320. The insulator layer 330 may by constructed as a single layer or as multiple layers. The thickness of the insulator layer 330 is preferably from approximately 2 mm to 10 mm, and more preferably from approximately 2 mm to 3 mm.

Preferably, the insulator layer 330 includes a hole 334 formed at a location underlying each target plate 340. Alternatively, the insulator layer 330 may have an area of reduced thickness (in lieu of a hole) at a location underlying each target plate 340. Preferably, the insulator layer 330 extends a significant distance under a disk-shaped electrostatic charge receiving portion 342 (discussed below) of the target plate 340 to substantially decrease the possibility of current flow around the target plate 340.

In one embodiment, the insulator layer 330 is formed by a suitable electric insulator or dielectric using chemical vapor deposition or other suitable conventional deposition technique to a desired depth. For example, the insulator layer 330 may be formed by depositing one or more layers of silicon dioxide on the electrically conductive plate 310 and/or the electrically conductive plate 320 using chemical vapor deposition, and then etching the silicon dioxide to form the hole 334 (or area of reduced thickness).

Other suitable electric insulators from which the insulator layer 330 may be formed include patternable insulators that are photopatternable such as epoxy, epoxy-acrylate or polyimide based resins which can be commercially obtained in liquid or dry form. In liquid form, the patternable insulators can be spin-coated, curtain-coated, screen-printed, etc., to desired thickness. In dry sheet form, the patternable insulators can be laminated. The insulator layer 330 may be formed by depositing or laminating a patternable insulator to the electrically conductive plate 310 and/or the electrically conductive plate 320. A photomask is then applied to the patternable insulator, followed by exposure to, for example, UV radiation. Subsequent development of the exposed areas results in the formation of the hole 334 (or area of reduced thickness).

The target plate 340 is constructed of one or more electrically conductive materials. For example, the target plate 340 may be formed from copper or other suitable metals (including elemental metals and metal alloys). Preferably, the electrical impedance of the target plate 340 is less than that of the electrically conductive plate 310. The target plate 340 may be constructed as a single-layer-plate or a multiple-layer-plate.

In one embodiment, the target plate 340 is formed by depositing one or more thin metal films using chemical vapor deposition, physical vapor deposition, flamespray techniques, thermal decomposition of a suitable metal-organic compound, or electroless or electrolytic plating with one or more suitable metals. For example, the target plate 340 may be formed layer-by-layer in the recess 314 of the electrically conductive plate 310 by depositing thin metal films (along with the impedance layer 350, which may also be deposited layer-by-layer within the recess).

In another embodiment, the target plate 340 is constructed from metal plate or sheet metal using conventional metalworking techniques. For example, the target plate 340 may be constructed from a metal blank that is machined to form a receiving portion and a discharge portion.

The target plate 340 is interposed between the electrically conductive plates 310 and 320 in a region overlying the hole 334 (or area of reduced thickness) of the insulator layer 330. Preferably, the target plate 340 is positioned at least partially within the recess 314 of the electrically conductive plate 310. In accordance with the preferred embodiments of the present invention, the target plate 340 is configured so that the high voltage that occurs on the electrically conductive plate 310 is directed towards the center of the target plate 340 (i.e., the path of lowest electrical impedance).

In the embodiment illustrated in FIGS. 3 and 4, the target plate 340 has an cylindrical "T-shaped" configuration that includes a disk-shaped electrostatic charge receiving portion 342 (labeled only in FIG. 4) and a cylinder-shaped discharge portion 344 (labeled only in FIG. 4). The cylinder-shaped discharge portion 344 projects from the center of the disk-shaped receiving portion 342 towards the electrically conductive plate 320 and overlies the hole 334 (or area of reduced thickness) in the insulator plate 330. The disk-shaped receiving portion 342 of the target plate 340 has a width that is substantially larger than the width of the cylinder-shaped discharge portion 344 of the target plate 340 (these widths are measured in the horizontal direction in FIG. 4).

The cylindrical "T-shaped" configuration of the target plate 340 illustrated in FIGS. 3 and 4 is merely exemplary. One skilled in the art will appreciate that the target plate may have other configurations. For example, the target plate may have a taper-shaped or pointed discharge portion rather than the cylinder-shaped discharge portion. Also, the target plate may be oval, square, rectangular, etc. rather than being cylindrical.

In the embodiment illustrated in FIGS. 3 and 4, a single target plate 340 is used in the enclosure panel 300. It may be desirable, however, to use more than one target plate per enclosure panel to provide better current path control. Typically, the size of each target plate may be smaller when the enclosure panel contains multiple target plates. In general, the size of each target plate is related to the size of the current density to be controlled. The diameter of the target plate preferably ranges from less than 10 mm to approximately 100 mm in diameter, and more preferably ranges from approximately 10 mm to 50 mm (especially if the target plate is incorporated into an enclosure panel containing multiple target plates).

The impedance layer 350 is constructed of one or more static dissipative materials. Preferably, the electrical impedance of the impedance layer 350 (i.e., the "targeted impedance") is less than the electrical impedance of the insulator layer 330. For example, the impedance layer 350 may be constructed from a polymer, a polymer/ceramic (metal oxide) composite, ceramic (metal oxide) material, or other suitable static dissipative material. Exemplary polymers include, but are not limited to, epoxies, polyimides, polyurethanes, parylene, polysulfones, polysulfides, benzylcyclobutenes (BCBs), nylons, polyvinylidene fluoride (PVDF), etc. Exemplary ceramics and metal oxides include, but are not limited to, $TiO_2$, $Ta_2O_5$, $BaTiO_3$, $SrTiO_3$, $PbZrTiO_3$, $LiNbO_3$, $PbMgTiO_3$, $PbMgNbO_3$, etc. If used in a polymer/ceramic composite, the ceramic powder typically has a useful particle size between 20 nm and 20 µm.

In one embodiment, the static dissipative material may be mixed with a solvent and deposited layer-by-layer within the recess 314 of the electrically conductive plate 310 (along with the target plate 340, which may also be deposited layer-by-layer within the recess) and then within the hole 334 of insulator layer 330. In this embodiment, the thickness of the impedance layer 350 may be influenced by the solvent content. The solvent is evaporated during the thermal processing resulting in a shrinkage to the desired thickness of the insulator layer 330. The polymer or polymer/ceramic composite can be deposited by standard techniques such as screen-printing, stenciling, spray-coating and doctor-blading. The thickness of the processed polymer or polymer/ceramic composite used in this embodiment to construct the impedance layer 350 preferably ranges from approximately 1 mm to 3 mm, and more preferably is approximately 1 mm. The impedance layer 350 may also be formed from more than one layer of static dissipative materials having different electrical impedances to tune the electronic properties of the impedance layer 350.

Static dissipative materials, which typically have resistivity values in the range of $10^7$ to $10^{11}$ ohms per square, are particularly suitable materials from which to construct the impedance layer 350 because such materials slowly dissipate electrostatic charge but prevent the development of undesirable leakage currents. For example, the impedance layer 350 may be constructed from a resistive foam or rubber. Conductive particles such as carbon particles or other suitable filler materials may be incorporated into the resistive foam or rubber to ensure that the impedance layer 350 has a non-zero conductivity (i.e., does not act as an insulator).

In one embodiment, the impedance layer 350 is injection molded around the target plate 340 using standard injection/insert molding techniques. A resistive foam or rubber is injection molded into the recess 314 of the electrically conductive plate 310 (in which the target plate 340 is pre-positioned as an insert) and into the hole 334 (or area of reduced thickness) of the insulator layer 330. The resistive foam or rubber may be injected through a through a hole (not shown) that may be formed in the electrically conductive plate 310 in fluid communication with the recess 314.

In general, suitable static dissipative materials from which to construct the impedance layer 350 will typically exhibit a sufficiently low impedance to allow current to flow to slowly dissipate electrostatic charge but prevent the development of undesirable leakage currents. Along with the selection of the static dissipative material(s) from which the impedance layer 350 is constructed, the thickness of the impedance layer 350 is also a factor in the "targeted impedance" provided by the impedance layer 350.

The impedance layer 350 at least partially surrounds the target plate 340 and fills the hole 334 (or area of reduced thickness) of the insulator layer 330. Accordingly, the target plate 340 is surrounded by a static dissipative material (i.e., the electrical impedance of the impedance layer 350 provides a "targeted impedance" that is higher than the impedance of the target plate 340 but lower that the impedance of the insulator layer 330) that the current path must take in order to reach the discharge point at the bottom of the target plate 350. The current seeks the lowest impedance path which will likely be the disk-shaped receiving portion 342 and then the cylinder-shaped discharge portion 344 of the target plate 340 on its way to the discharge point. Current coming from the electrically conductive plate 310 will tend to pass through the impedance layer 350 covering the target plate 340 and then the target plate 340, itself, and then again through the impedance layer 350, thus placing a controlled impedance into the path.

Preferably, the thickness of the impedance layer 350 is uniform to present approximately the same impedance no matter the direction of current flow to the target plate 340. The nested plates direct the current discharge or drain point to a central point, i.e., the targeted impedance. The current must flow through this area as it is the only path that can be taken due to the high impedance of the insulator layer 330. The targeted impedance (i.e., the impedance of the impedance layer 350 surrounding the target plate 340) can be controlled (e.g., via selecting the static dissipative material(s) from which the impedance layer 350 is constructed and the thickness of the impedance layer 350) to provide controlled impedance to the current flow. The likelihood of arcing is low due to the nested configuration of the nested plates.

Figure 5:
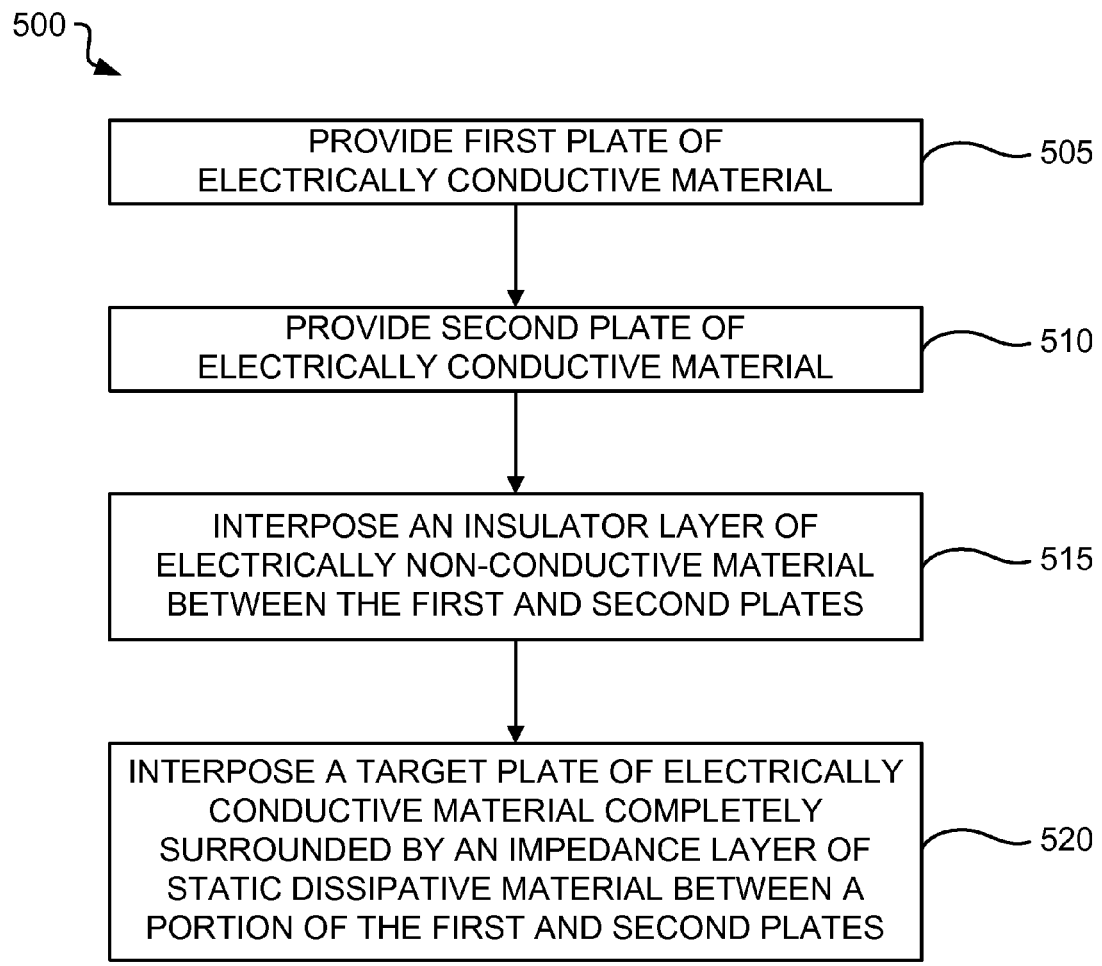
FIG. 5 is a flow diagram illustrating a method of making an apparatus for protecting an object that is sensitive to ESD in accordance with the preferred embodiments of the present invention.

FIG. 5 is a flow diagram illustrating a method 500 of making an apparatus for protecting an object that is sensitive to ESD in accordance with the preferred embodiments of the present invention. In the method 500, the steps discussed below (steps 505-520) are performed. These steps are set forth in their preferred order. It must be understood, however, that the various steps may occur at different times relative to one another than shown, or may occur simultaneously. Moreover, those skilled in the art will appreciate that one or more of the steps may be omitted.

The method 500 begins by providing a first plate of electrically conductive material (step 505). Referring temporarily to FIG. 3, this step may correspond to, for example, providing the electrically conductive plate 310.

The method 500 continues by providing a second plate of electrically conductive material (step 510). Referring temporarily to FIG. 3, this step may correspond to, for example, providing the electrically conductive plate 320.

Next, the method 500 continues by interposing an insulator layer of electrically non-conductive material between the first and second plates of electrically conductive material (step 515). Referring temporarily to FIG. 3, this step may correspond to, for example, depositing the insulator layer 330 on the electrically conductive plate 320.

Finally, the method 500 concludes by interposing a target plate of electrically conductive material completely surrounded by an impedance layer of static dissipative material between a portion of the first and second plates of electrically conductive material (step 520). Referring temporarily to FIG. 3, this step may correspond to, for example, pre-positioning the target plate 340 in the recess 314 of the electrically conductive plate 310 and then injection molding a resistive foam or rubber into the recess 314 to form the impedance layer 350.

Figure 6:
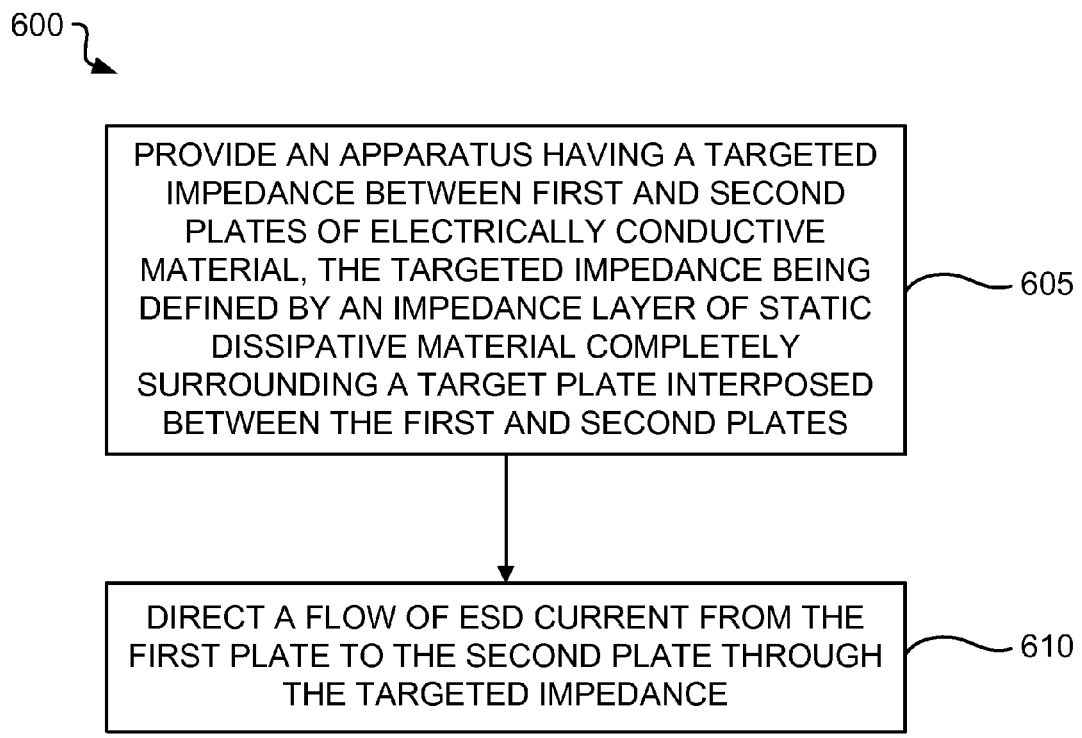
FIG. 6 is a flow diagram illustrating a method of protecting an object that is sensitive to ESD in accordance with the preferred embodiments of the present invention.

FIG. 6 is a flow diagram illustrating a method 600 of protecting an object that is sensitive to ESD in accordance with the preferred embodiments of the present invention. In the method 600, the steps discussed below (steps 605-610) are performed. These steps are set forth in their preferred order. It must be understood, however, that the various steps may occur at different times relative to one another than shown, or may occur simultaneously. Moreover, those skilled in the art will appreciate that one or more of the steps may be omitted.

The method 600 begins by providing an apparatus having a targeted impedance between first and second plates of electrically conductive material, the targeted impedance being defined by an impedance layer of static dissipative material completely surrounding a target plate interposed between the first and second plates of electrically conductive material (step 605). Referring temporarily to FIG. 1, this step may correspond to, for example, providing the computer system enclosure 101 having the targeted impedance 111 incorporated into the top panel 106. Referring now temporarily to FIG. 3, the targeted impedance is defined by the impedance layer 350 surrounding the target plate 340 interposed between the electrically conductive plate 310 (which corresponds to the outside surface of the top panel 106 illustrated in FIG. 1) and the electrically conductive plate 320.

The method 600 concludes by directing a flow of electrostatic discharge (ESD) current from the first plate of electrically conductive material to the second plate of electrically conductive material through the targeted impedance (step 610). Referring temporarily to FIG. 1, this step may correspond to, for example, when a user who has walked on a rug comes in contact with the top panel 106 of the server computer enclosure 101, any accumulated electrostatic charge on the user is injected to the top panel 106. Referring now to FIG. 3, the flow of ESD current is directed from the electrically conductive plate 310 (which corresponds to the outside surface of the top panel 106 illustrated in FIG. 1) to the electrically conductive plate 320 through the targeted impedance defined by the impedance layer 350.

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. An apparatus for protecting an object that is sensitive to electrostatic discharge (ESD), comprising:
   a first plate of electrically conductive material;
   a second plate of electrically conductive material;
   an insulator layer of electrically non-conductive material interposed between at least a portion of the first plate and at least a portion of the second plate, wherein the insulator layer includes a discontinuity in the form of either a hole or an area of reduced thickness;
   a target plate of electrically conductive material interposed between a portion of the first plate and a portion of the second plate, wherein the target plate is completely separated from the first plate and the second plate and is positioned to overlie the discontinuity of the insulator layer;
   an impedance layer of static dissipative material at least partially surrounds the target plate, wherein a first portion of the impedance layer is interposed between the first plate and the target plate, wherein a second portion of the impedance layer is interposed between the target plate and the second plate and extends within the discontinuity of the insulator layer, and wherein the electrical impedance of the impedance layer is less than the electrical impedance of the insulator layer; and wherein ESD current flows in a path from the first plate, then through the first portion of the impedance layer, then through the target plate, then through the second portion of the impedance layer and through the discontinuity of the insulator layer, and then to the second plate.

2. The apparatus as recited in claim 1, wherein the insulator layer includes a hole, wherein the first plate includes a recess that overlies the hole in the insulator layer, wherein target plate is positioned at least partially within the recess of the first plate, and wherein the impedance layer at least partially fills the hole of the insulator layer.

3. The apparatus as recited in claim 1, wherein the apparatus forms at least a portion of an enclosure of an electronic device, and wherein the enclosure contains one or more circuit assemblies sensitive to ESD.

4. The apparatus as recited in claim 3, wherein the electronic device is a server computer, and wherein the first plate forms at least a portion of a panel of the enclosure.

5. The apparatus as recited in claim 4, wherein the apparatus forms a portion of a cover of an electronics drawer that is moveably mounted within the server computer.

6. The apparatus as recited in claim 4, wherein the apparatus forms a portion of at least one outer panel of the server computer.

7. The apparatus as recited in claim 1, wherein the impedance layer is configured to interpose a substantially uniform electrical impedance between the first plate and the target plate.

8. The apparatus as recited in claim 7, wherein the impedance layer is configured to interpose a substantially uniform electrical impedance between the target plate and the second plate.

9. The apparatus as recited in claim 1, wherein the impedance layer is configured to interpose a substantially uniform electrical impedance between the target plate and the second plate.

10. The apparatus as recited in claim 1, wherein the impedance layer comprises a static dissipative material having a surface resistivity value within a range from $10^7$ to $10^{11}$ ohms per square.

11. The apparatus as recited in claim 1, wherein the target plate includes a disk-shaped electrostatic charge receiving portion from which a cylinder-shaped discharge portion projects, wherein the disk-shaped receiving portion has a width substantially larger than a width of the cylinder-shaped discharge portion, and wherein the respective widths of the disk-shaped receiving and cylinder-shaped discharge portions are measured in a direction perpendicular to the direction in which the cylinder-shaped discharge portion projects from the disk-shaped receiving portion.

12. A method of making an apparatus for protecting an object that is sensitive to electrostatic discharge (ESD), the method comprising the steps of:

providing a first plate of electrically conductive material;
providing a second plate of electrically conductive material;
interposing an insulator layer of electrically non-conductive material between at least a portion of the first plate and at least a portion of the second plate, wherein the insulator layer includes a discontinuity in the form of either a hole or an area of reduced thickness;

interposing a target plate of electrically conductive material at least partially surrounded by an impedance layer of static dissipative material between a portion of the first plate and a portion of the second plate, wherein the target plate is completely separated from the first plate and the second plate and is positioned to overlie the discontinuity of the insulator layer, wherein a first portion of the impedance layer is interposed between the first plate and the target plate, wherein a second portion of the impedance layer is interposed between the target plate and the second plate and extends within the discontinuity of the insulator layer, and wherein the electrical impedance of the impedance layer is less than the electrical impedance of the insulator layer; and wherein ESD current flows in a path from the first plate, then through the first portion of the impedance layer, then through the target plate, then through the second portion of the impedance layer and through the discontinuity of the insulator layer, and then to the second plate.

13. The method as recited in claim 12, wherein the insulator layer includes a hole, wherein the first plate includes a recess that overlies the hole in the insulator layer, wherein target plate is positioned at least partially within the recess of the first plate, and wherein the impedance layer at least partially fills the hole of the insulator layer.

14. The method as recited in claim 12, wherein the impedance layer is configured to interpose a substantially uniform electrical impedance between the first plate and the target plate.

15. The method as recited in claim 14, wherein the impedance layer is configured to interpose a substantially uniform electrical impedance between the target plate and the second plate.

16. The method as recited in claim 12, wherein the impedance layer is configured to interpose a substantially uniform electrical impedance between the target plate and the second plate.

17. A method of protecting an object that is sensitive to electrostatic discharge (ESD), the method comprising the steps of:

providing an apparatus having a targeted impedance between a first plate of electrically conductive material and a second plate of electrically conductive material, wherein the targeted impedance is defined by an impedance layer of static dissipative material at least partially surrounding a target plate of electrically conductive material interposed between the first and second plates, wherein the target plate is completely separated from the first plate and the second plate, wherein a first portion of the impedance layer is interposed between the first plate and the target plate, and wherein a second portion of the impedance layer is interposed between the target plate and the second plate;

directing a flow of ESD current from the first plate to the second plate through the targeted impedance, wherein the ESD current flows in a path from the first plate, then through the first portion of the impedance layer, then through the target plate, then through the second portion of the impedance layer, and then to the second plate.

18. The method as recited in claim 17, wherein the impedance layer is configured to interpose a substantially uniform electrical impedance between the first plate and the target plate.

19. The method as recited in claim 18, wherein the impedance layer is configured to interpose a substantially uniform electrical impedance between the target plate and the second plate.

20. The method as recited in claim 17, wherein the impedance layer is configured to interpose a substantially uniform electrical impedance between the target plate and the second plate.

\* \* \* \* \*